United States Patent
Kim et al.

(10) Patent No.: US 9,495,261 B2
(45) Date of Patent: Nov. 15, 2016

(54) SYSTEMS AND METHODS FOR REDUCING MEMORY FAILURES

(71) Applicant: QUALCOMM Incorporated, San Diego, CA (US)

(72) Inventors: Jung Pill Kim, San Diego, CA (US); Dexter Tamio Chun, San Diego, CA (US); Deepti Vijayalakshmi Sriramagiri, San Diego, CA (US); Mosaddiq Saifuddin, San Diego, CA (US); Xiangyu Dong, Sunnyvale, CA (US); Sungryul Kim, San Diego, CA (US); Yanru Li, San Diego, CA (US); Jungwon Suh, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 213 days.

(21) Appl. No.: 14/458,009

(22) Filed: Aug. 12, 2014

(65) Prior Publication Data

US 2015/0261632 A1 Sep. 17, 2015

Related U.S. Application Data

(60) Provisional application No. 61/952,786, filed on Mar. 13, 2014.

(51) Int. Cl.
| | |
|---|---|
| *G06F 11/00* | (2006.01) |
| *G06F 11/20* | (2006.01) |
| *G11C 29/52* | (2006.01) |
| *G06F 11/08* | (2006.01) |
| *G06F 11/30* | (2006.01) |
| *G11C 29/44* | (2006.01) |
| *G11C 29/04* | (2006.01) |

(52) U.S. Cl.
CPC .......... *G06F 11/2053* (2013.01); *G06F 11/08* (2013.01); *G06F 11/3037* (2013.01); *G11C 29/4401* (2013.01); *G11C 29/52* (2013.01); *G11C 2029/0409* (2013.01)

(58) Field of Classification Search
CPC ............... G06F 11/08; G06F 11/2053; G06F 11/3037; G11C 29/4401; G11C 29/52; G11C 2029/0409; G11C 2029/0411
See application file for complete search history.

(56) References Cited

U.S. PATENT DOCUMENTS

| | | |
|---|---|---|
| 7,751,264 B1 | 7/2010 | Wu et al. |
| 8,589,737 B2 | 11/2013 | Rohleder et al. |
| 8,671,329 B2 | 3/2014 | Kumar et al. |
| 2005/0283566 A1 | 12/2005 | Callaghan |
| 2009/0003046 A1 | 1/2009 | Nirschl et al. |
| 2009/0235145 A1* | 9/2009 | Ito .......................... G06F 11/106 714/764 |
| 2010/0322024 A1 | 12/2010 | Yagishita |
| 2011/0099458 A1* | 4/2011 | Reche ................... G06F 11/073 714/763 |

(Continued)

OTHER PUBLICATIONS

International Search Report and Written Opinion—PCT/US2015/020006—ISA/EPO—Sep. 17, 2015.

*Primary Examiner* — Joshua P Lottich
(74) *Attorney, Agent, or Firm* — Muncy, Geissler, Olds & Lowe, P.C.

(57) ABSTRACT

Methods and systems for an in-system repair process that repairs or attempts to repair random bit failures in a memory device are provided. In some examples, an in-system repair process may select alternative steps depending on whether the failure is correctable or uncorrectable. In these examples, the process uses communications between a system on chip and the memory to fix the failures during normal operation.

29 Claims, 6 Drawing Sheets

(56) References Cited

U.S. PATENT DOCUMENTS

| | | |
|---|---|---|
| 2011/0145632 A1 | 6/2011 | Waldspurger et al. |
| 2011/0157985 A1* | 6/2011 | Sudo .................. G06F 11/1048 365/185.09 |
| 2012/0246544 A1 | 9/2012 | Resnick et al. |
| 2012/0311402 A1* | 12/2012 | Tseng .................. G06F 11/1048 714/763 |
| 2013/0179750 A1 | 7/2013 | Hida et al. |
| 2013/0212449 A1 | 8/2013 | O'Connell |

* cited by examiner

SYSTEMS AND METHODS FOR REDUCING MEMORY FAILURES

CROSS-REFERENCE TO RELATED APPLICATION

The present Application for Patent claims the benefit of U.S. Provisional Application No. 61/952,786, entitled "SYSTEMS, APPARATUS, AND METHODS FOR LOCATIONS OF A MOBILE DEVICE," filed Mar. 13, 2014, assigned to the assignee hereof, and expressly incorporated herein by reference in its entirety.

FIELD OF DISCLOSURE

This disclosure relates generally to memory devices, and more specifically, but not exclusively, to correct random bit fails in memory devices.

BACKGROUND

Dynamic Random Access Memory (DRAM) fail bit counts are expected to increase significantly as DRAM technology approaches its scaling limit (~10 nm nodes). The more fail bit counts increase, the less stable memory system become and system backup solutions to prevent this fatal problem are required.

DRAM specifications define post package repair (PPR) to repair the small number of fails that occur during package assembly. This specification assumes the DRAM receives the fail address captured by a tester during the final test of the DRAM after assembly. However, this scheme does not provide the solutions to fix the random errors that occur at the system level during operation.

Accordingly, there are long-felt industry needs for methods that improve upon conventional methods including the improved methods and apparatus provided hereby.

The inventive features that are characteristic of the teachings, together with further features and advantages, are better understood from the detailed description and the accompanying figures. Each of the figures is provided for the purpose of illustration and description only, and does not limit the present teachings.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

Some examples of the disclosure are directed to systems, apparatus, and methods for improving the random bit fails caused by memory devices such as DRAM and system memory.

In some examples of the disclosure, the system, apparatus, and method includes an in-system repair process that uses communications between a system on chip and the memory to fix failures during normal operation.

In some examples of the disclosure, the method for in-system repair of a memory failure may include initiating operation of a memory; detecting a failure; determining if the failure is one of correctable and uncorrectable; upon determining the failure is correctable, performing a correctable error repair process; and upon determining the failure is uncorrectable, performing an uncorrectable error repair process. Some examples may also include storing at least one of a failure address, available repair steps, and an error flag; reading information related to the failure; and executing repair instructions. Some examples may also include entering a temporary programming mode; executing a programming entry command; and exiting the temporary programming mode. Some examples may also include determining if data at the failure address is stored in a first memory location; upon determining if the data is stored, writing the data in a second memory location; and upon determining if the data is not stored is the first memory location, writing pattern data in the second memory location. Some examples may also include determining if the uncorrectable repair process is successful; upon determining the uncorrectable repair process is not successful, invalidating the uncorrectable repair process and one of executing a second programming entry command and generating a system fail call; and upon determining the uncorrectable repair process is successful, continuing operation of the memory.

Other features and advantages associated with the apparatus and methods disclosed herein will be apparent to those skilled in the art based on the accompanying drawings and detailed description.

BRIEF DESCRIPTION OF THE DRAWINGS

The accompanying drawings are presented to describe examples of the present teachings, and are not limiting. The accompanying drawings are presented to aid in the description of examples of the disclosure and are provided solely for illustration of the examples and not limitation thereof.

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure, and in which.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all compo-

DETAILED DESCRIPTION

Methods for cavity formation in a semiconductor package substrate are provided. The exemplary methods disclosed herein advantageously address the long-felt industry needs, as well as other previously unidentified needs, and mitigate shortcomings of the conventional methods. For example, an advantage provided by the disclosed system and methods herein is an improvement in cost, system reliability, and decreased fail bits over conventional memory and methods.

Various aspects are disclosed in the following description and related drawings to show specific examples relating to examples of the disclosure. Alternate examples will be apparent to those skilled in the pertinent art upon reading this disclosure, and may be constructed and practiced without departing from the scope or spirit of the disclosure. Additionally, well-known elements will not be described in detail or may be omitted so as to not obscure the relevant details of the aspects and examples disclosed herein.

The word "exemplary" is used herein to mean "serving as an example, instance, or illustration." Any example described herein as "exemplary" is not necessarily to be construed as preferred or advantageous over other examples. Likewise, the term "examples" does not require that all examples include the discussed feature, advantage or mode of operation. Use of the terms "in one example," "an example," "in one feature," and/or "a feature" in this specification does not necessarily refer to the same feature and/or example. Furthermore, a particular feature and/or structure can be combined with one or more other features and/or structures. Moreover, at least a portion of the apparatus described hereby can be configured to perform at least a portion of a method described hereby.

The terminology used herein is for the purpose of describing particular examples only and is not intended to be limiting of examples of the disclosure. As used herein, the singular forms "a," "an," and "the" are intended to include the plural forms as well, unless the context clearly indicates otherwise. It will be further understood that the terms "comprises", "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should be noted that the terms "connected," "coupled," or any variant thereof, mean any connection or coupling, either direct or indirect, between elements, and can encompass a presence of an intermediate element between two elements that are "connected" or "coupled" together via the intermediate element. Coupling and/or connection between the elements can be physical, logical, or a combination thereof. As employed herein, elements can be "connected" or "coupled" together, for example, by using one or more wires, cables, and/or printed electrical connections, as well as by using electromagnetic energy. The electromagnetic energy can have wavelengths in the radio frequency region, the microwave region and/or the optical (both visible and invisible) region. These are several non-limiting and non-exhaustive examples.

It should be understood that the term "signal" can include any signal such as a data signal, audio signal, video signal, multimedia signal, analog signal, and/or digital signal. Information and signals can be represented using any of a variety of different technologies and techniques. For example, data, an instruction, a process step, a command, information, a signal, a bit, and/or a symbol described in this description can be represented by a voltage, a current, an electromagnetic wave, a magnetic field and/or particle, an optical field and/or particle, and any combination thereof.

Any reference herein to an element using a designation such as "first," "second," and so forth does not limit the quantity and/or order of those elements. Rather, these designations are used as a convenient method of distinguishing between two or more elements and/or instances of an element. Thus, a reference to first and second elements does not mean that only two elements can be employed, or that the first element must necessarily precede the second element. Also, unless stated otherwise, a set of elements can comprise one or more elements. In addition, terminology of the form "at least one of: A, B, or C" used in the description or the claims can be interpreted as "A or B or C or any combination of these elements."

Further, many examples are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the disclosure may be embodied in a number of different forms, all of which have been contemplated to be within the scope of the claimed subject matter. In addition, for each of the examples described herein, the corresponding form of any such examples may be described herein as, for example, "logic configured to" perform the described action.

In this description, certain terminology is used to describe certain features. The term "mobile device" can describe, and is not limited to, a mobile phone, a mobile communication device, a pager, a personal digital assistant, a personal information manager, a mobile hand-held computer, a laptop computer, a wireless device, a wireless modem, and/or other types of portable electronic devices typically carried by a person and/or having communication capabilities (e.g., wireless, cellular, infrared, short-range radio, etc.). Further, the terms "user equipment" (UE), "mobile terminal," "mobile device," and "wireless device," can be interchangeable.

Figure 1:
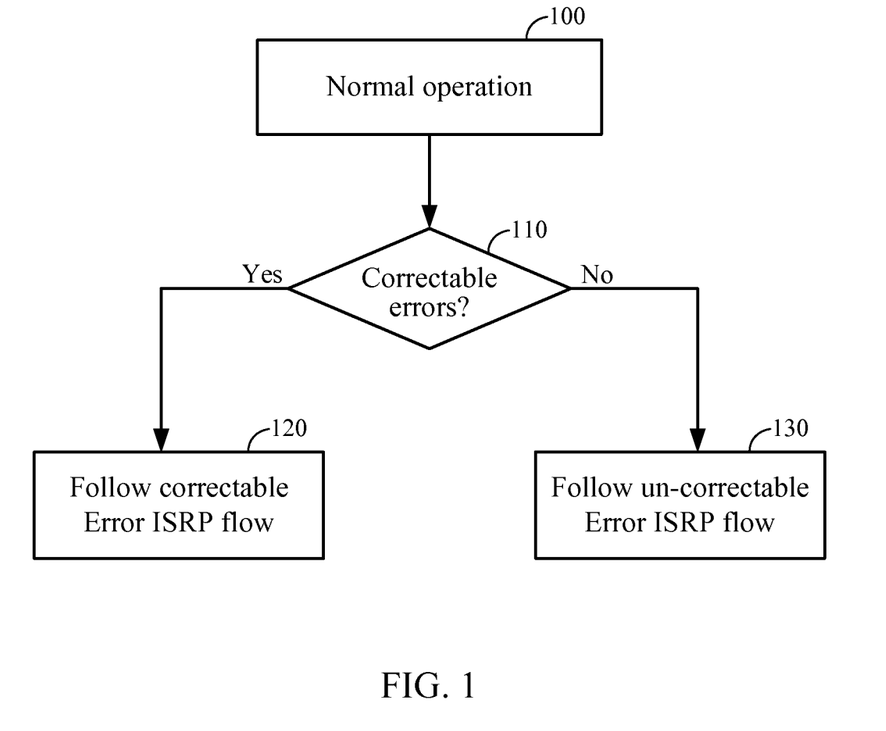
FIG. 1 depicts an exemplary in-system repair in accordance with an example of the disclosure.

FIG. 1 depicts an example for in-system repair of random bit failures. In FIG. 1, a flow chart for a memory device such as a DRAM is illustrated. Step 100, normal operation for the memory device is initiated. During normal operation, a random bit failure may occur. During the occurrence of the bit fail, the memory device may detect the occurrence attempt to ascertain whether the fail is fixable or not. Step 110, the memory device detects and determines if the bit fail detected is correctable. If correctable, the memory device moves to step 120. If the bit fail is uncorrectable, the memory device moves to step 130. Step 120, the memory device initiates an in-system repair process (ISRP) to repair a bit fail during normal operation of the memory device. Step 130, the memory device initiates an in-system repair process for an uncorrectable bit failure.

Figure 2:
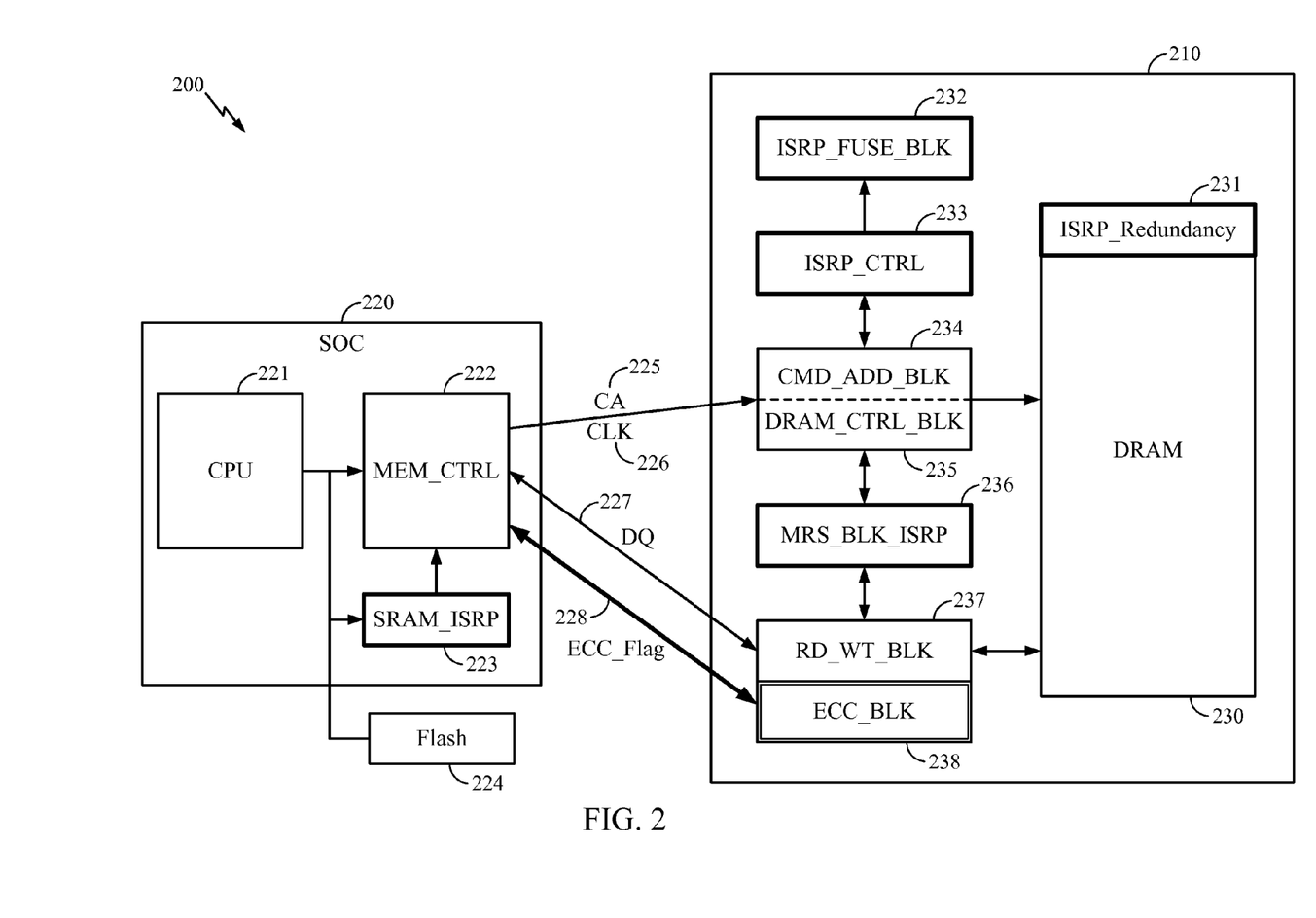
FIG. 2 depicts an exemplary in-system repair in accordance with an example of the disclosure.

FIG. 2 depicts an example of the disclosure for an uncorrectable error flow. In FIG. 2, a memory device 200 includes a memory 210 and a system on chip (SoC) 220. Memory 210 may include a DRAM 230 with an in-system repair process (ISRP) redundancy 231. The ISRP redundancy 231 may store the contents of the DRAM 230 at the bit failure address of DRAM 230. In other words, the contents of the memory at the failure address. The memory 210 may also include an ISRP fuse block (ISRP_FUSE_BLK) 232, an ISRP control (ISRP_CTRL) 233, a command add block (CMD_ADD_BLK) 234, a DRAM control block (DRAM_TRL_BLK) 235, a MRS block ISRP (MRS_BLK_ISRP) 236 for storing fail addresses and status bits of those failures, a read write block (RD_WT_BLK) 237, and an error checking and correction block (ECC_BLK) 238.

As shown in FIG. 2, SoC 220 may include CPU 221, memory control (MEM_CTRL) 222, static random access memory (SRAM_ISRP) 223, and an associated flash memory 224. The SRAM_ISRP 223 may store failure row data and address. The MEM_CTRL 222 may send a CA 225 and a clock (CLK) 226 signals, indications, or flags to DRAM_CTRL_BLK 235; DQ 227 signal, indication, or flag to RD_WT_BLK 237; and receive an ECC_Flag 228 signal, indication, or flag from ECC_BLK 238.

Figure 3:
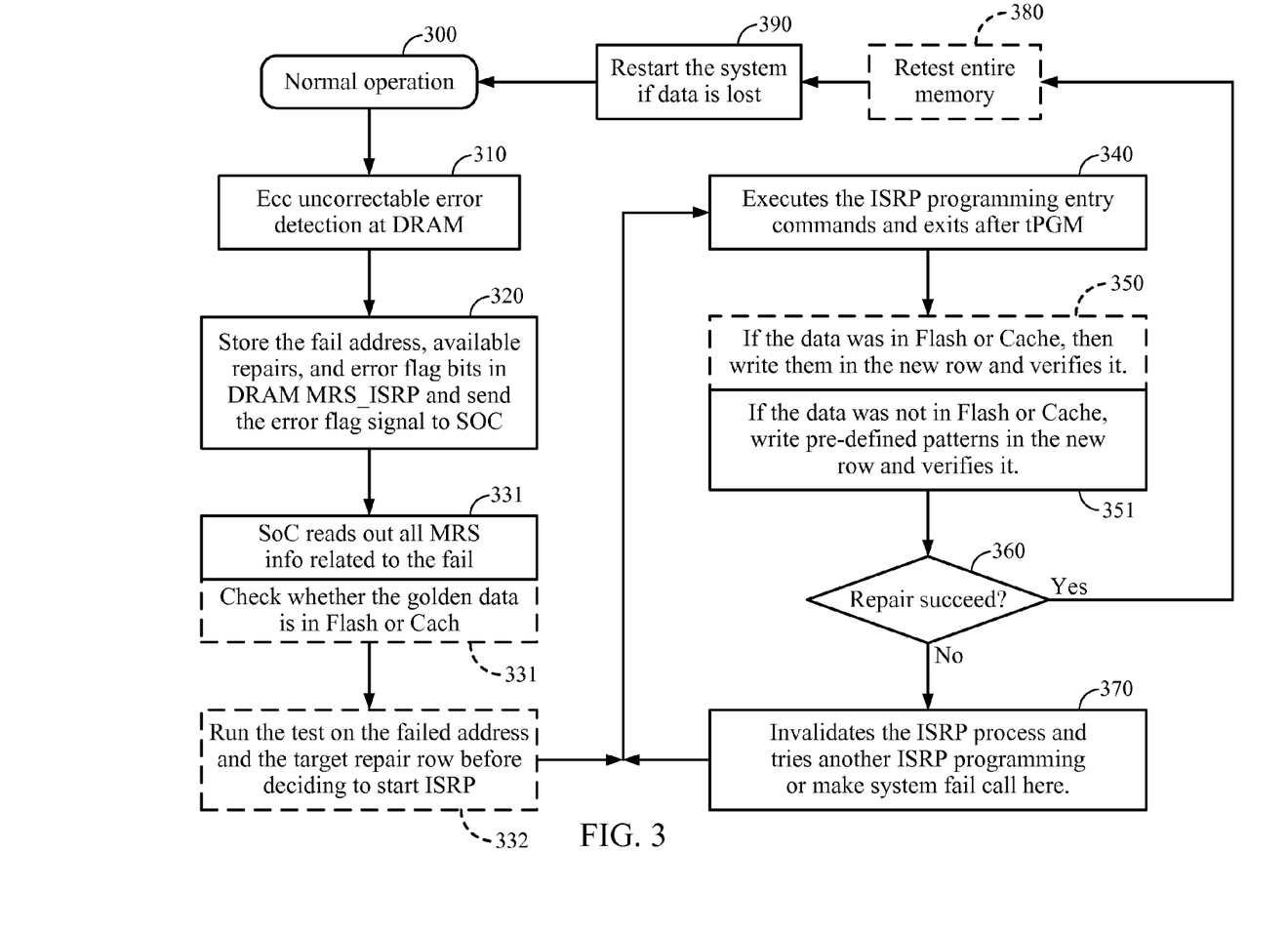
FIG. 3 depicts an exemplary in-system repair in accordance with an example of the disclosure.

FIG. 3 depicts an example of the disclosure for an uncorrectable error flow. Step 300, normal operation of a memory device is initiated. This flow may benefit from close communication between the SoC and the DRAM. Step 310, an ECC uncorrectable error detection at the DRAM occurs. Step 320, the fail address, available repairs, and error flag bits are stored in DRAM MRS_ISRP and an error flag signal is sent to SoC. In step 330, the SoC reads out all MRS info related to the failure. Step 331, the process may also check whether the golden data is in Flash memory or a Cache memory. Step 332, the process may also run a test on the failed address and the target repair row before deciding to start ISRP. Step 340, the process may execute the ISRP programming entry commands and exits after tPGM. Step 350, if the data was in flash or cache memory, then the process writes the data in the new row and verifies the data. Step 351, if the data was not in either flash or cache memory, the process writes pre-defined patterns in the new row and verifies the write operation. The pre-defined patterns may be any type of default or preset data pattern. Step 360, a determination may be made as to whether the repair was successful or not. Step 370, if the repair was not successful, the process invalidates the ISRP process and tries another ISRP programming and returns to step 340 or makes a system fail call and ends the process. Step 380, a retest of a portion or the entire memory may be conducted. Step 390, the system is restarted if the data is lost.

Figure 4:
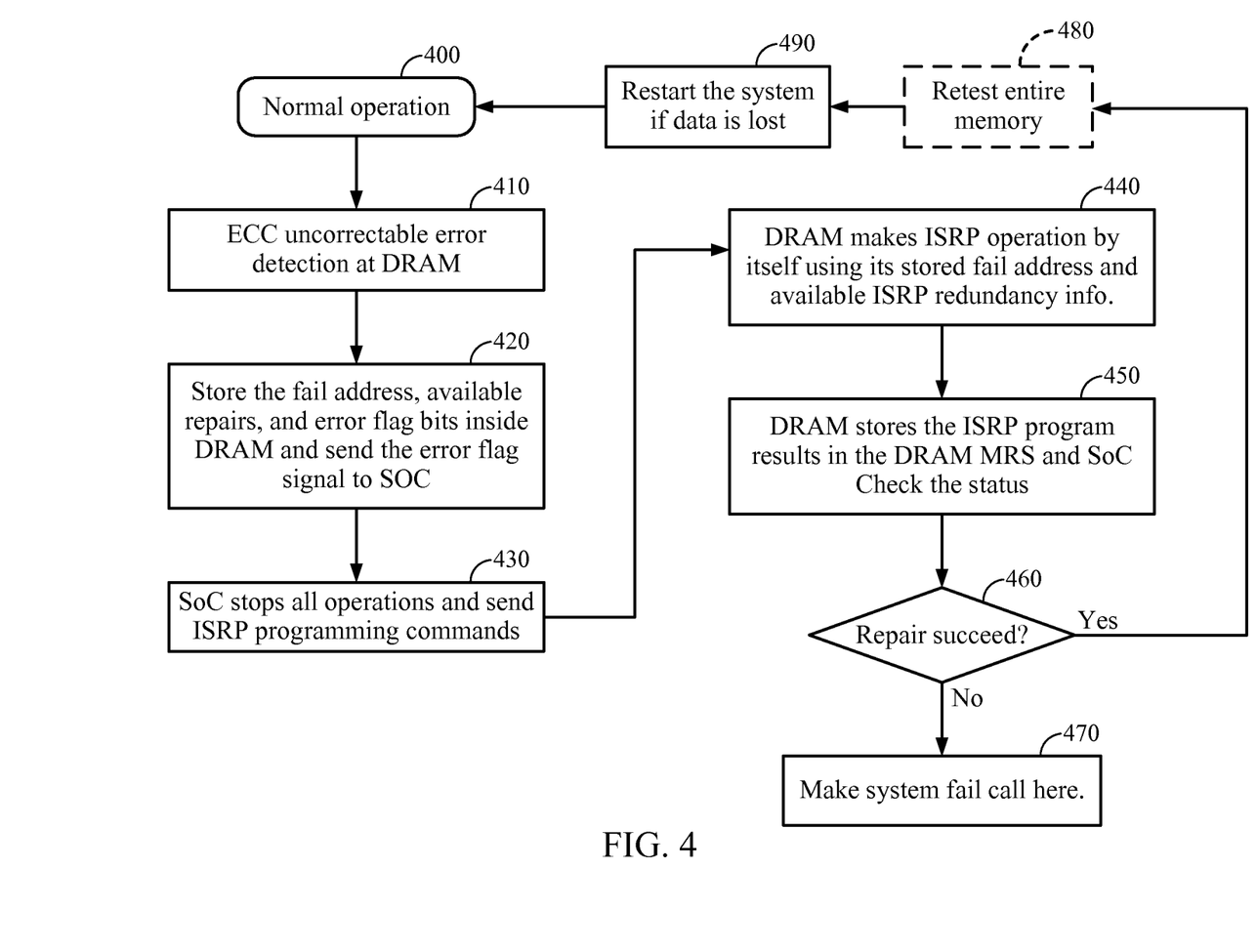
FIG. 4 depicts an exemplary in-system repair in accordance with an example of the disclosure.

FIG. 4 depicts an example of the disclosure for an uncorrectable error flow. Step 400, normal operation of a memory device is initiated. This flow may benefit from relying on more DRAM repair process. Step 410, an ECC uncorrectable error detection at the DRAM occurs. Step 420, the fail address, available repairs, and error flag bits are stored in DRAM and an error flag signal is sent to SoC. In step 430, the SoC stops all operations and sends ISRP programming commands to the DRAM. Step 440, the DRAM makes the ISRP operation by itself using its stored failure address and available ISRP redundancy information. Step 450, the DRAM stores the ISRP program results in the DRAM MRS and SoC and checks the status.

Step 460, a determination may be made as to whether the repair was successful or not. Step 470, if the repair was not successful, the process invalidates the ISRP process, makes a system fail call, and ends the process. Step 480, a retest of a portion or the entire memory may be conducted. Step 490, the system is restarted if the data is lost.

Figure 5:
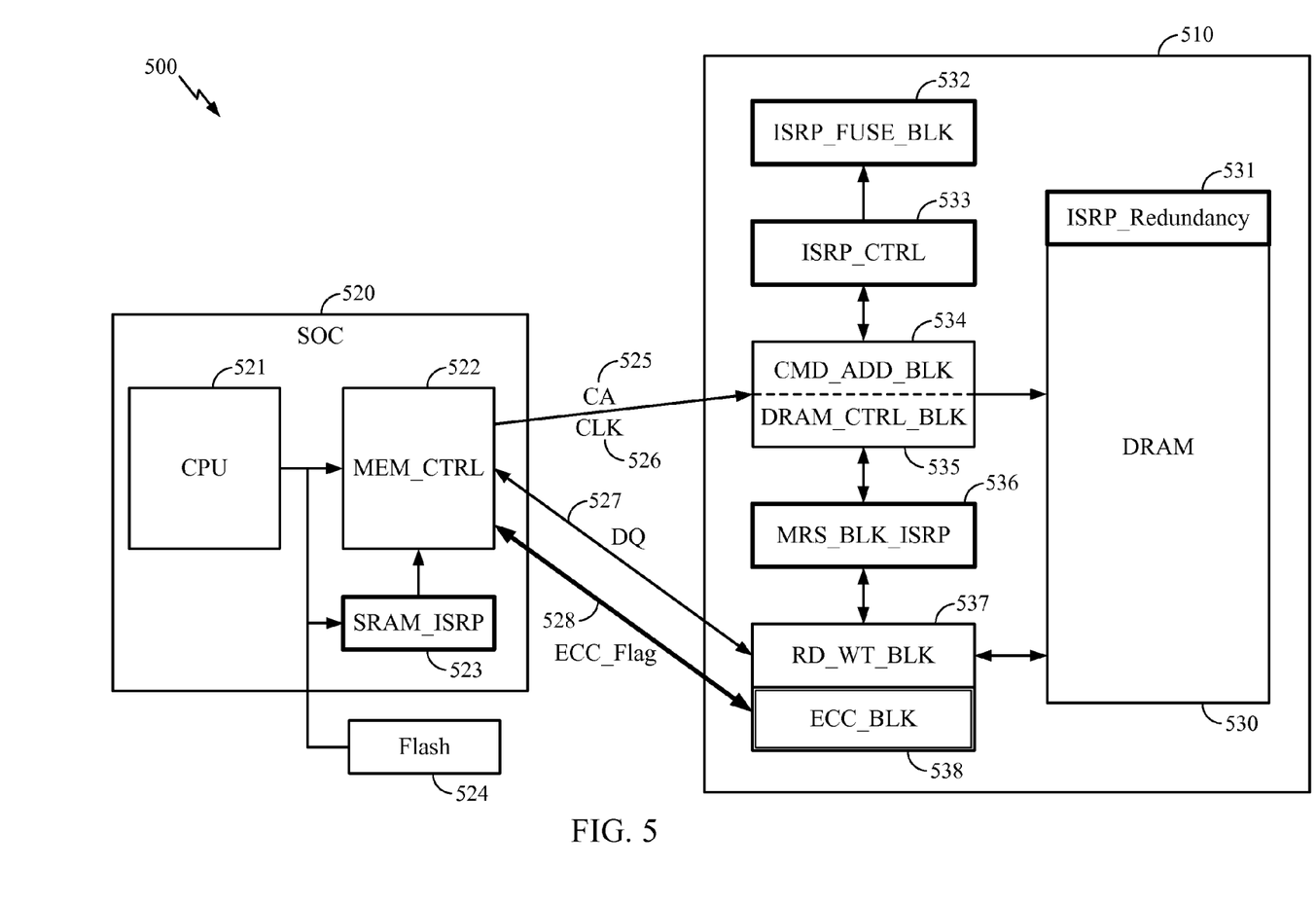
FIG. 5 depicts an exemplary in-system repair in accordance with an example of the disclosure.

FIG. 5 depicts an example of the disclosure for a correctable error flow. In FIG. 5, a memory device 500 includes a memory 510 and a system on chip (SoC) 520. Memory 510 may include a DRAM 530 with an in-system repair process (ISRP) redundancy 531. The ISRP redundancy 531 may store the contents of the DRAM 530 at the bit failure address of DRAM 530. In other words, the contents of the memory at the failure address. The memory 510 may also include an ISRP fuse block (ISRP_FUSE_BLK) 532, an ISRP control (ISRP_CTRL) 533, a command add block (CMD_ADD_BLK) 534, a DRAM control block (DRAM_CTRL_BLK) 535, a MRS block ISRP (MRS_BLK_ISRP) 536 for storing fail addresses and status bits of those failures, a read write block (RD_WT_BLK) 537, and an error checking and correction block (ECC_BLK) 538. ECC_BLK 538 may allow a number of repeatable error checks.

As shown in FIG. 5, SoC 520 may include CPU 521, memory control (MEM_CTRL) 522, static random access memory (SRAM_ISRP) 523, and an associated flash memory 524. The SRAM_ISRP 523 may store failure row data and address. The MEM_CTRL 522 may send a CA 525 and a clock (CLK) 526 signals, indications, or flags to DRAM_CTRL_BLK 535; DQ 527 signal, indication, or flag to RD_WT_BLK 537; and an ECC_Flag 528 signal, indication, or flag to ECC_BLK 538.

Figure 6:
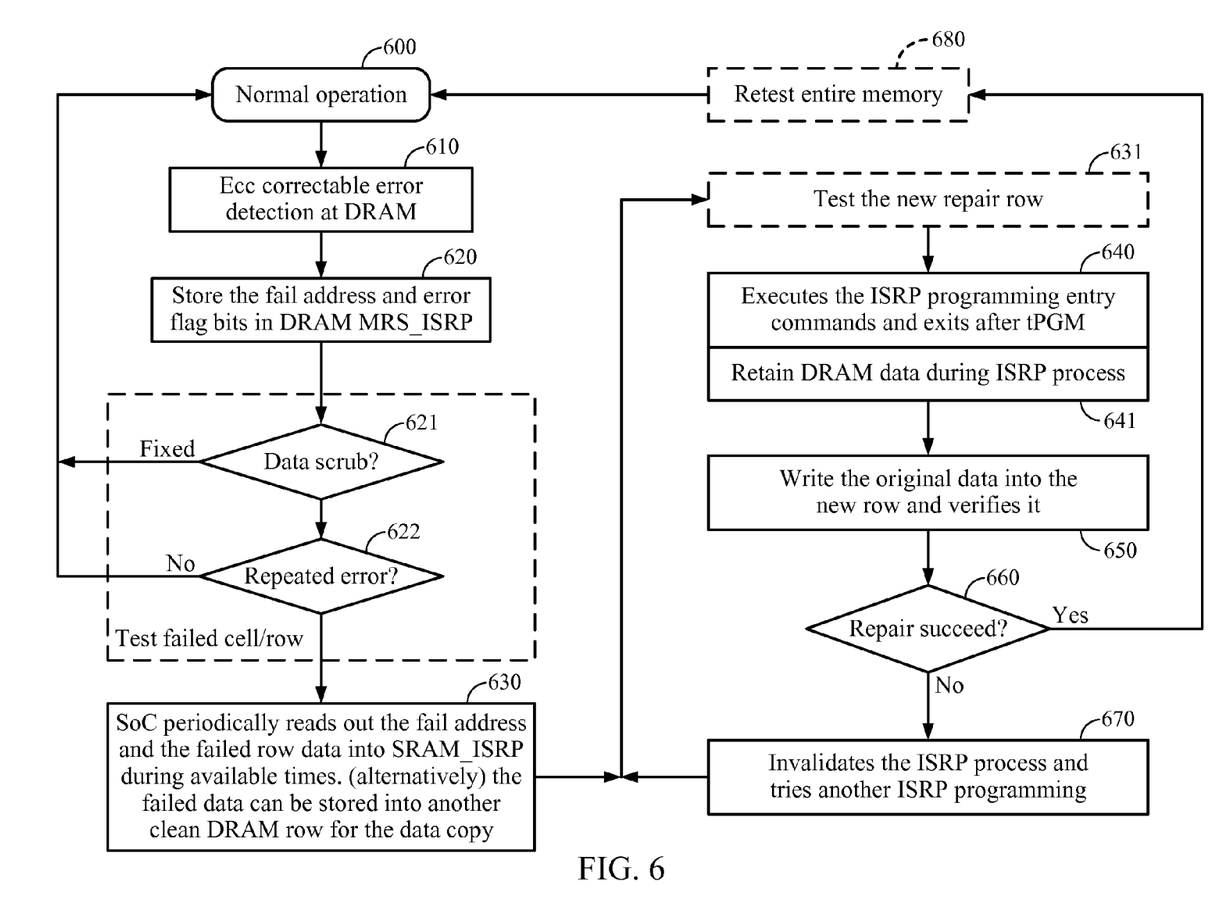
FIG. 6 depicts an exemplary in-system repair in accordance with an example of the disclosure.

FIG. 6 depicts an example of the disclosure for a correctable error flow. Step 600, normal operation of a memory device is initiated. Step 610, an ECC correctable error detection at the DRAM occurs. Step 620, the fail address, available repairs, and error flag bits may be stored in DRAM MRS_ISRP and an error flag signal may be sent to SoC. Step 621, a determination is made about a data scrub. If the data scrub is successful, the process returns to normal operation—step 600. If a data scrub is unsuccessful, the process may process to check if the error is repeated in step 622. Step 622, a determination is made to see if the error is repeated. If the error is not repeated, the process returns to normal operation, step 600. If the error is repeated, the process may proceed to step 630. Steps 621 and 622 optionally test a failed cell or row to see if a data scrub fixes the error. Step 630, the SoC periodically may read out the failure address and the failed row data into SRAM_ISRP during available times. Optionally, the failed data can be stored in another clean DRAM row for the data copy. Step 631, the process may also test the repair row before proceeding with the process.

Step 640, the process may execute the ISRP programming entry commands and exits after tPGM. Step 641, the memory device may retain the DRAM data during the ISRP process as a backup. Step 650, the original data may be written into a new row and verifies the write data operation. Step 660, a determination may be made as to whether the repair was successful or not. Step 670, if the repair was not successful, the process invalidates the ISRP process and tries another ISRP programming and returns to step 631 or step 640. Step 680, a retest of a portion or the entire memory may be conducted if the repair was successful.

Nothing stated or illustrated depicted in this application is intended to dedicate any component, step, feature, benefit, advantage, or equivalent to the public, regardless of whether the component, step, feature, benefit, advantage, or the equivalent is recited in the claims.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the examples disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The methods, sequences and/or algorithms described in connection with the examples disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

The various illustrative logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

Although some aspects have been described in connection with a device, it goes without saying that these aspects also constitute a description of the corresponding method, and so a block or a component of a device should also be understood as a corresponding method step or as a feature of a method step. Analogously thereto, aspects described in connection with or as a method step also constitute a description of a corresponding block or detail or feature of a corresponding device. Some or all of the method steps can be performed by a hardware apparatus (or using a hardware apparatus), such as, for example, a microprocessor, a programmable computer or an electronic circuit. In some examples, some or a plurality of the most important method steps can be performed by such an apparatus.

The examples described above merely constitute an illustration of the principles of the present disclosure. It goes without saying that modifications and variations of the arrangements and details described herein will become apparent to other persons skilled in the art. Therefore, it is intended that the disclosure be restricted only by the scope of protection of the appended patent claims, rather than by the specific details presented on the basis of the description and the explanation of the examples herein.

In the detailed description above it can be seen that different features are grouped together in examples. This manner of disclosure should not be understood as an intention that the claimed examples require more features than are explicitly mentioned in the respective claim. Rather, the situation is such that inventive content may reside in fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or a plurality of claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods disclosed in the description or in the claims can be implemented by a device comprising means for performing the respective steps or actions of this method.

Furthermore, in some examples, an individual step/action can be subdivided into a plurality of sub-steps or contain a plurality of sub-steps. Such sub-steps can be contained in the disclosure of the individual step and be part of the disclosure of the individual step.

Accordingly, an example of the disclosure can include a computer readable media embodying a method for location estimation. Accordingly, the disclosure is not limited to illustrated examples and any means for performing the functionality described herein are included in examples of the disclosure.

While the foregoing disclosure shows illustrative examples of the disclosure, it should be noted that various changes and modifications could be made herein without departing from the scope of the disclosure as defined by the appended claims. The functions, steps and/or actions of the method claims in accordance with the examples of the disclosure described herein need not be performed in any particular order. Furthermore, although elements of the disclosure may be described or claimed in the singular, the plural is contemplated unless limitation to the singular is explicitly stated.

What is claimed is:

1. A method for in-system repair of a memory failure, the method comprising:
 initiating operation of a memory;
 detecting, by the memory, a failure;
 determining, by the memory, if the failure is correctable or uncorrectable;
 upon determining the failure is correctable, performing a correctable error repair process;

upon determining the failure is uncorrectable, performing an uncorrectable error repair process;
communicating a fail status and information through a channel connecting the memory and a System on Chip (SoC);
testing a failure address and a target repair row without an external device; and
executing, by the SoC, a repair process by the SoC.

2. The method of claim 1, wherein detecting the failure includes detecting a random bit failure in the memory.

3. The method of claim 1, wherein the memory is a dynamic random access memory.

4. The method of claim 1, wherein the uncorrectable error repair process further comprises:
storing at least one of the failure address, available repair steps, or an error flag;
reading information related to the failure; and
executing repair instructions.

5. The method of claim 4, wherein reading the information related to the failure includes determining if data at the failure address is stored in a first memory location.

6. The method of claim 4, executing the repair instructions further comprises:
entering a temporary programming mode;
executing a programming entry command; and
exiting the temporary programming mode.

7. The method of claim 6, further comprising:
determining if data at the failure address is stored in a first memory location;
upon determining if the data is stored, writing the data in a second memory location; and
upon determining if the data is not stored is the first memory location, writing pattern data in the second memory location.

8. The method of claim 7, wherein the second memory location is tested to verify the writing pattern data.

9. The method of claim 6, further comprising:
determining if the uncorrectable error repair process is successful;
upon determining the uncorrectable error repair process is not successful, invalidating the uncorrectable error repair process and one of executing a second programming entry command or generating a system fail call; and
upon determining the uncorrectable error repair process is successful, continuing the operation of the memory.

10. The method of claim 9, wherein continuing the operation of the memory further comprises:
testing at least a portion of the memory; and
restarting the operation of the memory.

11. The method of claim 1, wherein the uncorrectable error repair process further comprises:
storing at least one of the failure address, available repair steps, and an error flag;
reading information related to the failure in the memory;
stopping the operation of the memory; and
executing repair instructions.

12. The method of claim 11, wherein a system on chip component stops the operation of the memory and the memory executes the repair instructions.

13. The method of claim 11, further comprising:
sending programming commands to the memory; and
initiating programming commands using the stored failure address and available redundancy information.

14. The method of claim 13, further comprising storing the programming commands in first and second memory locations.

15. The method of claim 14, wherein the first and second memory locations are tested to verify the storing the programming commands.

16. The method of claim 15, further comprising:
determining if the uncorrectable error repair process is successful;
upon determining the uncorrectable error repair process is not successful, invalidating the uncorrectable error repair process and generating a system fail call; and
upon determining the uncorrectable error repair process is successful, continuing the operation of the memory.

17. The method of claim 16, wherein continuing the operation of the memory further comprises:
testing at least a portion of the memory; and
restarting the operation of the memory.

18. A method for in-system repair of a memory failure, the method comprising:
initiating operation of a memory;
detecting, by the memory, a failure;
determining, by the memory, if the failure is one of a correctable failure or an uncorrectable failure;
upon detecting the correctable failure, performing a correctable error repair process;
communicating a fail status and information through a channel connecting the memory and a System on Chip (SoC);
testing a failure address and a target repair row without an external device; and
executing, by the SoC, a repair process.

19. The method of claim 18, further comprising:
upon detecting the uncorrectable failure, performing the following:
storing at least one of the failure address, available repair steps, or an error flag;
performing a data scrub operation;
determining if the data scrub operation is successful;
upon determining the data scrub operation is successful; returning to continued operation of the memory; and
upon determining the data scrub operation is unsuccessful, executing repair instructions.

20. The method of claim 19, further comprising:
determining if the failure is repeated;
upon determining the failure is not repeated, returning to continued operation of the memory; and
upon determining the failure is repeated, executing the repair instructions.

21. The method of claim 18, further comprising:
storing at least one of the failure address, available repair steps, or an error flag; and
reading the failure address and failure data.

22. The method of claim 21, further comprising storing the failure data in a second memory location.

23. The method of claim 22, further comprising testing the failure address and the failure data to determine if the failure is corrected.

24. The method of claim 22, further comprising:
entering a temporary programming mode;
executing a programming entry command; and
exiting the temporary programming mode.

25. The method of claim 24, further comprising:
storing memory data;
writing the memory data in the second memory location; and
testing the second memory location to verify the writing the memory data.

26. The method of claim 25, further comprising:
   determining if the correctable error repair process is successful;
   upon determining the correctable error repair process is not successful, invalidating the correctable error repair process and executing a second programming entry command; and
   upon determining the correctable error repair process is successful, continuing the operation of the memory.

27. The method of claim 26, wherein continuing the operation of the memory further comprises testing at least a portion of the memory.

28. A memory system, comprising:
   a memory configured to detect a failure, determine if the failure is correctable or uncorrectable;
   a system on chip component, the system on chip component configured to communicate with the memory;
   a repair process component configured to perform an in-system repair of correctable and uncorrectable memory failures and test a failure address and a target repair row without an external device.

29. A non-transitory machine readable medium comprising machine readable instructions that, when executed by a processor, cause the processor to:
   initiate operation of a memory;
   detect, by the memory, a failure;
   determine, by the memory, if the failure is correctable or uncorrectable;
   upon determining the failure is correctable, perform a correctable error repair process;
   upon determining the failure is uncorrectable, perform an uncorrectable error repair process;
   communicate a fail status and information through a channel connecting the memory and a System on Chip (SoC);
   testing a failure address and a target repair row without an external device; and
   executing, by the SoC, a repair process by the SoC.

* * * * *